US011137695B2

(12) United States Patent
Donkerbroek et al.

(10) Patent No.: US 11,137,695 B2
(45) Date of Patent: Oct. 5, 2021

(54) METHOD OF DETERMINING A HEIGHT PROFILE, A MEASUREMENT SYSTEM AND A COMPUTER READABLE MEDIUM (71) Applicant: ASML Netherlands B.V., Veldhoven (NL)

(72) Inventors: Arend Johannes Donkerbroek, Aarle-Rixtel (NL); Jeroen Cottaar, Eindhoven (NL); Thomas Theeuwes, Veldhoven (NL); Erik Johan Koop, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/339,273

(22) PCT Filed: Sep. 8, 2017

(86) PCT No.: PCT/EP2017/072590
§ 371 (c)(1),
(2) Date: Apr. 3, 2019

(87) PCT Pub. No.: WO2018/065167
PCT Pub. Date: Apr. 12, 2018

(65) Prior Publication Data
US 2019/0294060 A1    Sep. 26, 2019

(30) Foreign Application Priority Data

Oct. 6, 2016 (EP) .................................... 16192548

(51) Int. Cl.
*G03F 9/00* (2006.01)
*G03F 7/20* (2006.01)
*H01L 21/027* (2006.01)

(52) U.S. Cl.
CPC ........ *G03F 9/7034* (2013.01); *G03F 7/70633* (2013.01); *G03F 9/7019* (2013.01); *G03F 9/7023* (2013.01); *G03F 9/7026* (2013.01); *G03F 9/7057* (2013.01); *H01L 21/0274* (2013.01)

(58) Field of Classification Search
CPC . H01L 21/0274; G03F 9/7019; G03F 9/7026; G03F 9/7011; G03F 9/7003;
(Continued)

(56) References Cited

U.S. PATENT DOCUMENTS

2005/0030507 A1    2/2005   Teunissen et al.
2005/0134816 A1    6/2005   Modderman et al.
(Continued)

FOREIGN PATENT DOCUMENTS

CN    100565354 C    12/2009
EP    1566696 A1    8/2005
WO    2015131969 A1    9/2015

OTHER PUBLICATIONS

International Search Report directed to related International Patent Application No. PCT/EP2017/072590, dated Nov. 15, 2017; 4 pages.
(Continued)

*Primary Examiner* — Ermias T Woldegeorgis
(74) *Attorney, Agent, or Firm* — Sterne, Kessler, Goldstein & Fox P.L.L.C.

(57) ABSTRACT

Method of measuring a height profile of one or more substrates is provided comprising measuring a first height profile of one or more fields on a substrate using a first sensor arrangement, the first height profile being the sum of a first interfield part and a first intrafield part, measuring a second height profile of one or more further fields on the substrate or on a further substrate using a second sensor arrangement, the second height profile being the sum of a second interfield part and a second intrafield part, determin-
(Continued)

ing from the measurements with the first sensor arrangement an average first intrafield part, and determining the height profile of the further fields from the second interfield part and the average first intrafield part thereby correcting the measurements of the second sensor arrangement.

14 Claims, 6 Drawing Sheets

(58) Field of Classification Search
CPC .... G03F 9/7034; G03F 9/7023; G03F 9/7057; G03F 7/70633; G03B 27/52
See application file for complete search history.

(56) References Cited

U.S. PATENT DOCUMENTS

| 2006/0001026 | A1 | 1/2006 | Sashida |
| 2006/0238761 | A1* | 10/2006 | Lin ..................... G03F 7/705 356/401 |
| 2007/0252963 | A1 | 11/2007 | Modderman et al. |
| 2009/0325087 | A1* | 12/2009 | Lyons ................... G03F 9/7019 430/30 |
| 2010/0110401 | A1 | 5/2010 | Chung |
| 2015/0170904 | A1 | 6/2015 | Tsen et al. |

OTHER PUBLICATIONS

International Preliminary Report on Patentability and Written Opinion of the International Searching Authority directed to related International Patent Application No. PCT/EP2017/072590, dated Apr. 9, 2019; 7 pages.

Kahlenberg et al., "Best Focus Determination: Bridging the Gap Between Optical and Physical Topography," Proc. of SPIE, vol. 6520, 2007, pp. 65200Z-1-65200Z-8.

Le-Gratiet et al., "How Holistic Process Control Translates into High Mix Logic Fab APC?" Proc. of SPIE, vol. 9231, 2014, pp. 92310V-1-92310V-9.

Chinese Search Report directed to related Chinese Patent Application No. 201780061824, dated Jul. 10, 2020; 1 page.

* cited by examiner

Figure 6

METHOD OF DETERMINING A HEIGHT PROFILE, A MEASUREMENT SYSTEM AND A COMPUTER READABLE MEDIUM

CROSS-REFERENCE TO RELATED APPLICATIONS

This application is a 35 U.S.C. 371 National Phase of PCT Application No. PCT/EP2017/072590, filed on Sep. 8, 2017, which claims priority to EP Application No. 16192548.2 filed Oct. 6, 2016, the disclosures of each of which are hereby incorporated by reference in their entirety.

FIELD

The present invention generally relates to a method of compensating for process errors, a measurement system and a computer readable medium.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

Manufacturing different layers of the IC often requires imaging different patterns on different layers with different reticles. Therefore, reticles may be changed during the lithographic process or different lithographic apparatus may be used for different process steps, each of the different lithographic apparatus for example having different reticles.

The substrate is imaged using a projection system. Before the substrate is imaged, however, a focus sensor maps the topography of the top surface of the substrate to determine focus-positioning parameters of the projection system. Such mapping may be carried out on a first substrate table. While a first substrate table is underneath the projection system so as to allow exposure of a first substrate located on that table, a second substrate table can run to a loading position, unload an exposed substrate, pick up a new substrate and have the focus sensor map a topography of the top surface of the new substrate. Ideally, the focus sensor should sense the top surface of the substrate, and not be affected by underlying layers deposited on the substrate as part of the fabrication process. Such layers may have a certain pattern partly due to an earlier exposure of the substrate using the same or a different projection system. Additionally, the focus sensor should have a reasonable working gap between the focus sensor and the substrate (in order to protect the substrate (e.g., silicon wafer)). Commonly used focus sensors include optical and capacitance sensor systems.

Unfortunately, optical and capacitance sensor systems are often affected by the optical and capacitive properties of the underlying layers. For example, light used in an optical sensor system may reflect from an underlying layer and interfere with light reflected from the top surface. Similarly, capacitance sensor systems can be affected, for example, by the permeability and conductivity of the deposited layers, as well as quality and thickness of polish and oxide on the bottom surface of the substrate which is opposite to the top surface of the substrate.

Because optical and capacitance sensor systems may interact with the underlying layers, these types of sensor systems may misread the top surface of the substrate. Errors that are dependent on layers deposited as a result of chip production are called process errors. As a result, data obtained from the optical and capacitance sensor systems will often include these process errors. In fact, the process errors of an optical sensor system can be even larger than the physical thickness of the deposited layers on the substrate. Significant work is then needed to attempt to reduce the process errors, and some focus accuracy may even be lost.

The surface of the substrate may be divided into fields. One field is exposed and since these fields are illuminated with the same pattern on a reticle, a height profile of the substrate surface can be expressed as a sum of an interfield part and an intrafield part. The intrafield part describes the measurement component of the image of the pattern on the reticle (within one field) and the interfield part is the height profile that typically describes components that are non-repetitive per field. Similar to the height profile itself, the process errors can be divided into two categories: interfield process errors and intrafield process errors.

Presently, a first sensor arrangement, such as an air gauge, may measure a first height profile. A second sensor arrangement, such as the aforementioned optical and/or capacitive sensor, may measure a second height profile. Measurements using the first sensor arrangement may take more time than measurements using the second sensor arrangement, but the measurements using the second sensor arrangement may be less accurate. Therefore, while measurements of the first height profile preferably extend over only a part of the top surface of the substrate, the measurements of the second height profile preferably extend over substantially the entire surface. Subsequently, a first average intrafield height profile is determined from the first height map and a second intrafield part is determined from the second height map.

By comparing the first average intrafield height profile and the second intrafield parts the intrafield process errors are determined. These intrafield process errors are then used to correct for fields of the part of the surface of the subject substrate not measured by the first sensor as well as for surfaces of other substrates that have undergone the same or a similar process. Such a process not necessarily uses the same lithographic apparatus for one or more process steps.

However, the intrafield process errors have been found to vary per substrate, especially if for a certain process step different lithographic apparatus are used on different substrates. For example, fifty substrates may go through the aforementioned certain process step and twenty substrates of these fifty substrates are processed on a first lithographic apparatus and thirty substrates of these fifty substrates are processed on a second lithographic apparatus. If the intrafield process error is determined using one of the twenty substrates, this intrafield process is more reliable for correction of the other nineteen substrates of the twenty substrates than for the thirty substrates which are processed on the second lithographic apparatus instead of the first lithographic apparatus, even if the first and the second lithographic apparatus are of the same type. On the other hand, if the intrafield process error is determined using one of the thirty substrates, this intrafield process is more reliable for correction of the other twenty-nine substrates of the thirty substrates than for the twenty substrates which are processed on the first lithographic apparatus instead of the second lithographic apparatus.

Also, measurements using the second sensor of the fields of the substrate on which the intrafield process error has been determined, but which fields do not lie inside the part of the surface on which the measurements of the first height profile has been performed, are more accurately corrected using the determined intrafield process error than measurements of fields on the other substrates using the second sensor even though the same devices have been used for all preceding process steps.

SUMMARY

Given the foregoing, what are needed is systems, methods, and computer program products to more accurately compensate for intrafield process errors in a lithographic tool.

To meet this need, a method of determining a height profile of one or more substrates is provided, the method comprising measuring a first height profile of one or more fields on a substrate using a first sensor arrangement, the first height profile being the sum of a first interfield part and a first intrafield part, measuring a second height profile of one or more further fields on the substrate or on a further substrate using a second sensor arrangement, the second height profile being the sum of a second interfield part and a second intrafield part, determining from the measurements with the first sensor arrangement an average first intrafield part of at least one field of the one or more fields of which the first height profile is measured, and determining a height profile of the further fields from the second interfield part and the average first intrafield part.

According to another aspect, there is provided a measurement system configured to determine a height profile of a substrate, the measurement system comprising a first sensor arrangement configured to measure a first height profile of one or more fields on the substrate, the first height profile being the sum of a first interfield part and a first intrafield part, and a second sensor arrangement configured to measure a second height profile of one or more further fields on the substrate or on a further substrate, the second height profile being the sum of a second interfield part and a second intrafield part, the measurement system further being configured to determine from measurements with the first sensor arrangement an average first intrafield part of at least one field of the one or more fields of which the first height profile is measured and to determine the height profile of the further fields from the second interfield part and the average first intrafield part.

The first sensor arrangement may be an air gauge and the second sensor arrangement may, for instance, be an optical sensor, such as an array of level sensors, or the second sensor may be a capacitive sensor.

According to yet another aspect computer readable medium for storing computer readable code, wherein the code, when executed, causes a measurement system, for example the measurement system mentioned above to perform the aforementioned method.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
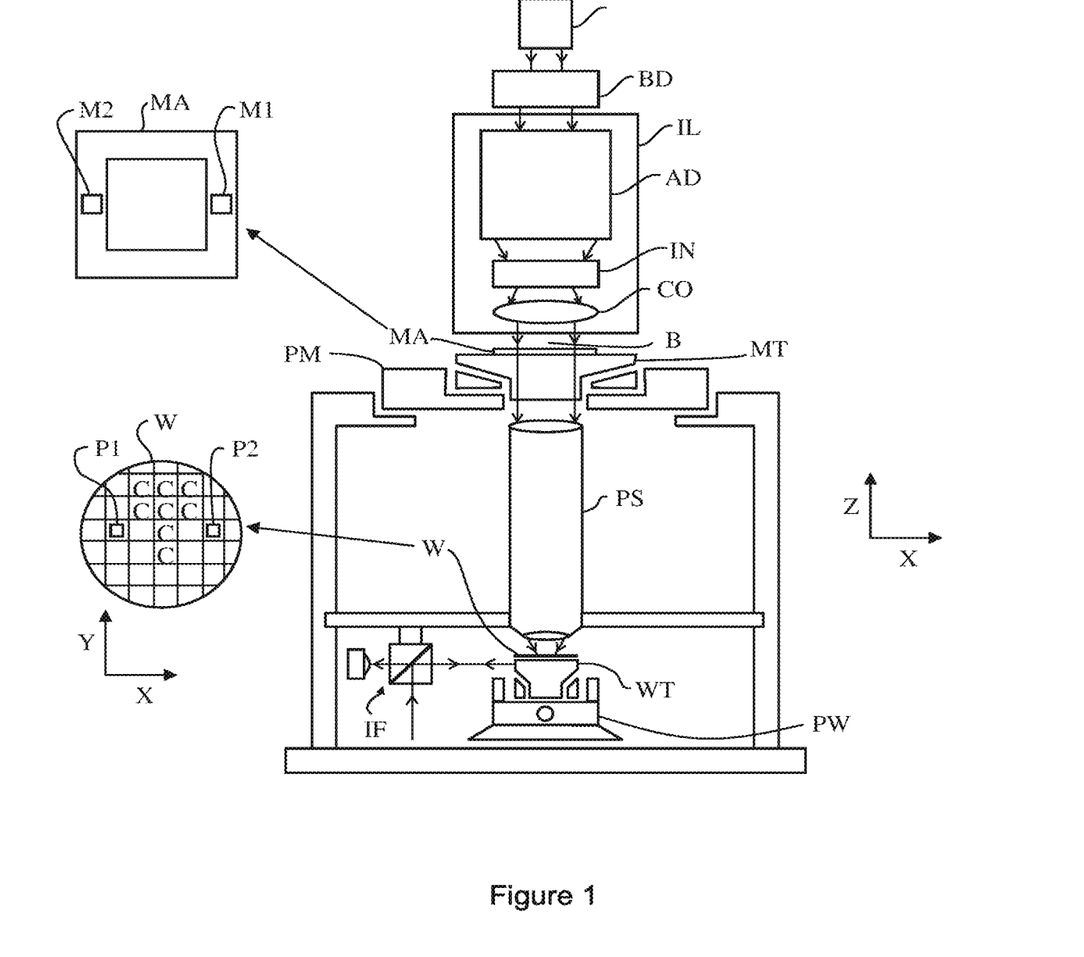
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C, also often referred to as a field (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
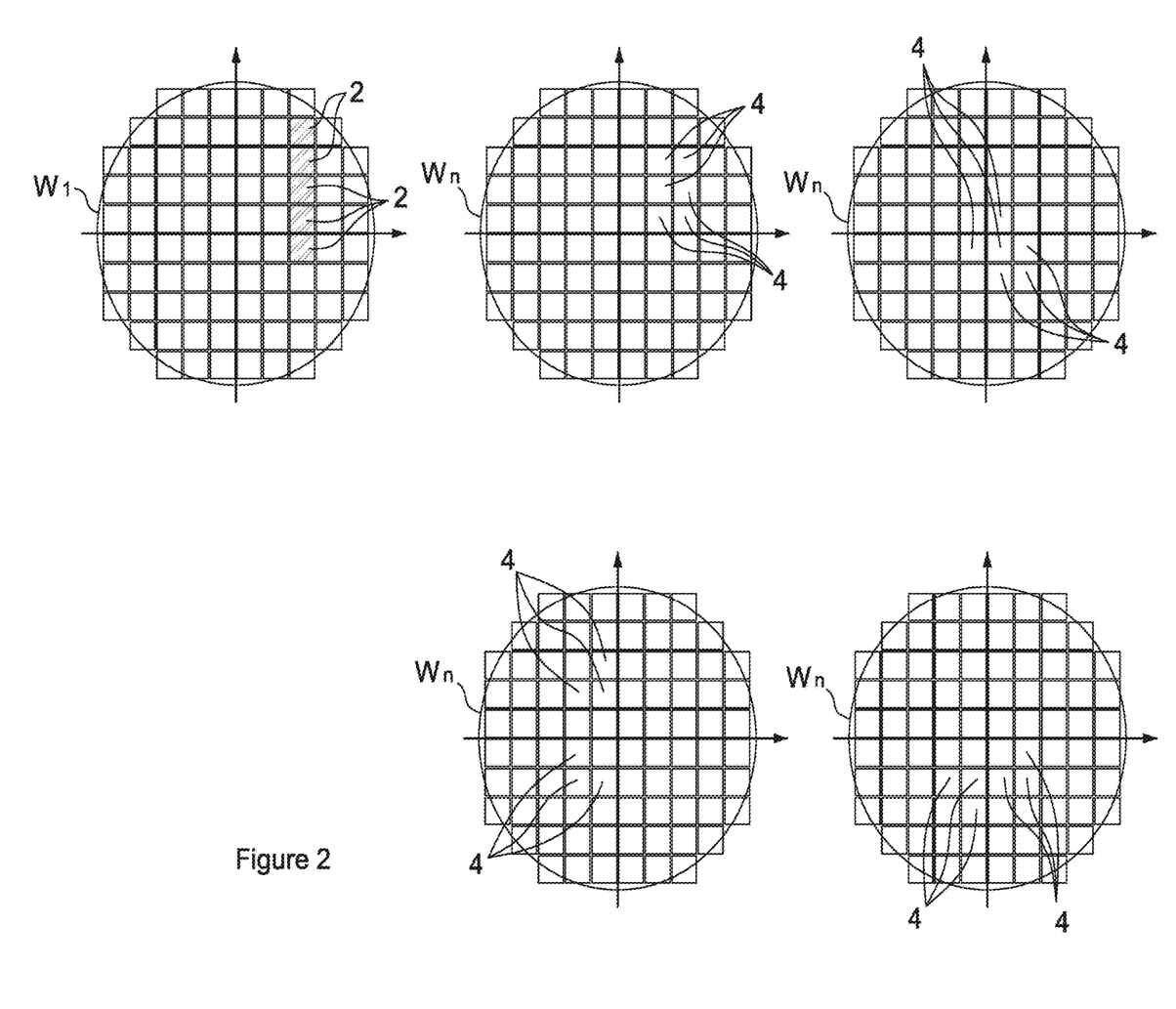
FIG. 2 illustrates a number of substrates of which the height profile is to be determined.

A method of determining a height profile which compensates for process errors is explained using FIG. 2. FIG. 2 shows a first substrate W1 and several further substrates Wn that are to be exposed by a lithographic apparatus. On the first substrate W1 a first height profile of an area on the substrate, in this example five fields 2, is measured using a first sensor. The area is chosen such that from the measured first height profile an average first height profile of a field is calculable. In FIG. 2, the area is shown to be formed by five fields 2, and an average first height profile of a field is calculated from these five fields 2. These five fields 2 are shown as hatched squares in FIG. 2. On each of the further substrates Wn a second height profile is measured of one or more further fields 4 using a second sensor. The further fields 4 are shown as non-hatched on the further substrates Wn in FIG. 2. The first height profile is the sum of a first interfield part and a first intrafield part and each of the second height profiles (as measured on each of the further substrates) is the sum of a second interfield part and a second intrafield part. From the first height profile an average first intrafield part is determined of at least one field of the one or more fields of which the first height profile is measured. The average first intrafield part may be calculated by determining the first intrafield part from the first height profile and subsequently determining the average first intrafield part from the first intrafield part.

From the measurements with the second sensor the second interfield part is determined. From the second interfield part and the average first intrafield part a height profile of the further fields are determined, for example by adding for each of the further fields the average first intrafield part to the second interfield part. Based on the height profile determined in this manner focus-positioning parameters of a projection system, such as the projection system PS of FIG. 1, are set. Since the second intrafield part does not play a role in determining the height profile, no the intrafield process errors are present. Thus the measurements of the second sensor are corrected (or compensated) by using the average intrafield part determined from measurement with the first sensor in the calculation of the height profile.

Figure 3:
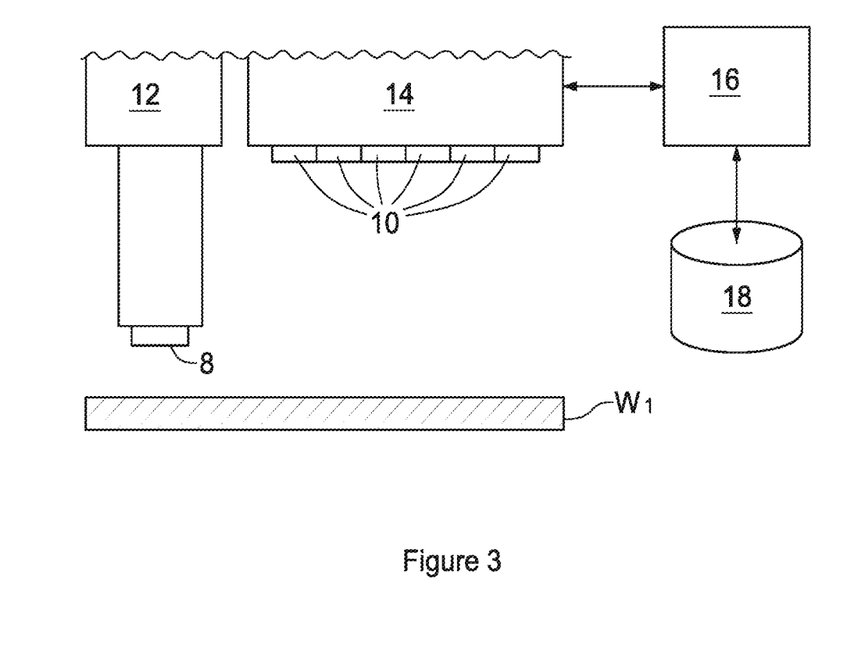
FIG. 3 schematically depicts a measurement system that may be used to determine a height profile.

FIG. 3 schematically depicts a measurement system 6 that may be used to determine the height profile.

Referring to FIG. 3, a first sensor arrangement may be embodied as an air gauge 8 and a second sensor arrangement may be embodied as an optical sensor including an array of level sensors 10. The air gauge 8 and the level sensors 10 are fixed to their respective frames 12 and 14 that are moveable parallel to the xy-plane.

FIG. 3 also discloses a calculation module 16 configured to determine focus-positioning parameters based on measurements of the first sensor arrangement and the second sensor arrangement. Also shown is a database 18 configured to store data collected by the first sensor arrangement and the second sensor arrangement.

Figure 4:
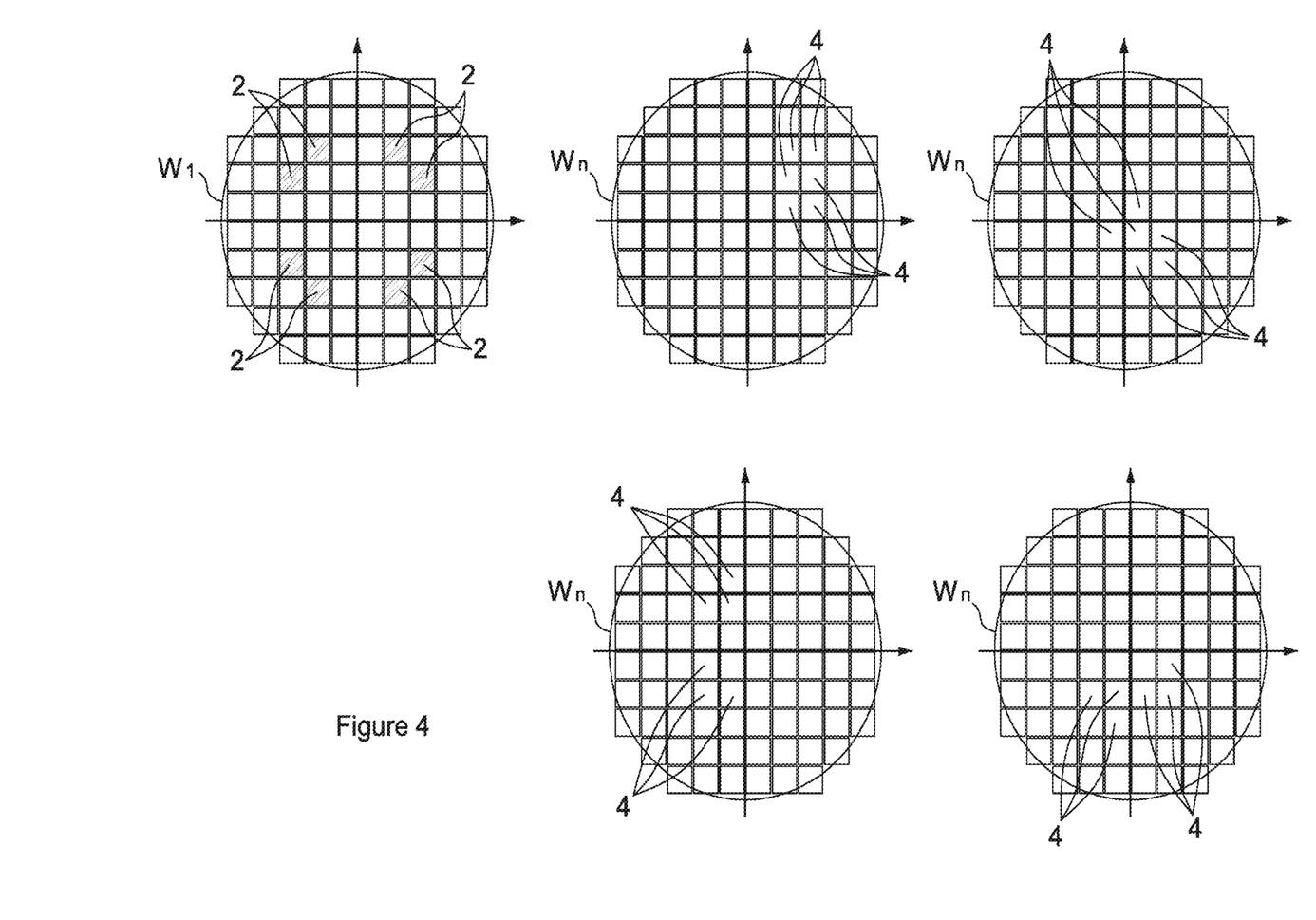
FIG. 4 illustrates another number of substrates of which the height profile is to be determined.

Although five fields are indicated in FIG. 2 of which to measure the first height profile with the first sensor arrangement, a different amount of fields may be chosen. Also these fields are not required to be connected as in FIG. 2. An the fields may alternatively be unconnected as shown in FIG. 4.

Figure 5:
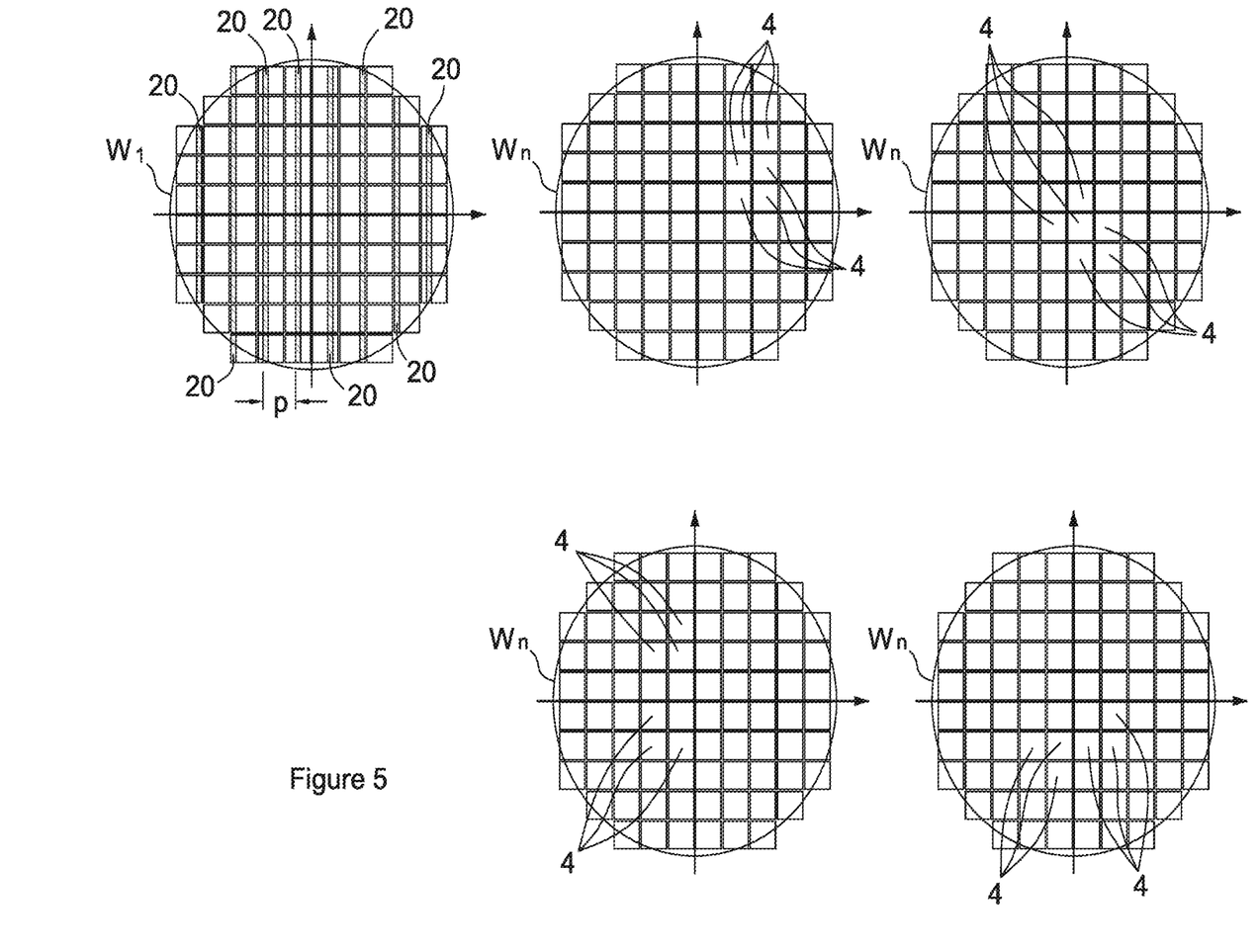
FIG. 5 illustrates another number of substrates of which the height profile is to be determined.

Yet another example of an area from which an average first height profile is calculable is depicted in FIG. 5. A first sensor arrangement may measure a first height profile on tracks 20 on the substrate which are one fifth of a field width wide and run parallel to the y-axis, while the second sensor arrangement measures a second height profile on the substrate simultaneously. The first and second sensor arrangement may be fixed with respect to each other. The second sensor arrangement scans a portion of the substrate W that is six fifths of field width wide. After the second sensor arrangement has completed a scan along the y-axis, the second arrangement is shifted six fifths of a field width along the x-axis and performs a subsequent scan along the y-axis. Since the first sensor arrangement is fixed with respect to the second sensor arrangement, the pitch p of the tracks 20 is also six fifths of a field width. As a person skilled in the art will readily acknowledge an average first height profile of a field on the substrate is calculable from these tracks 20.

Figure 6:
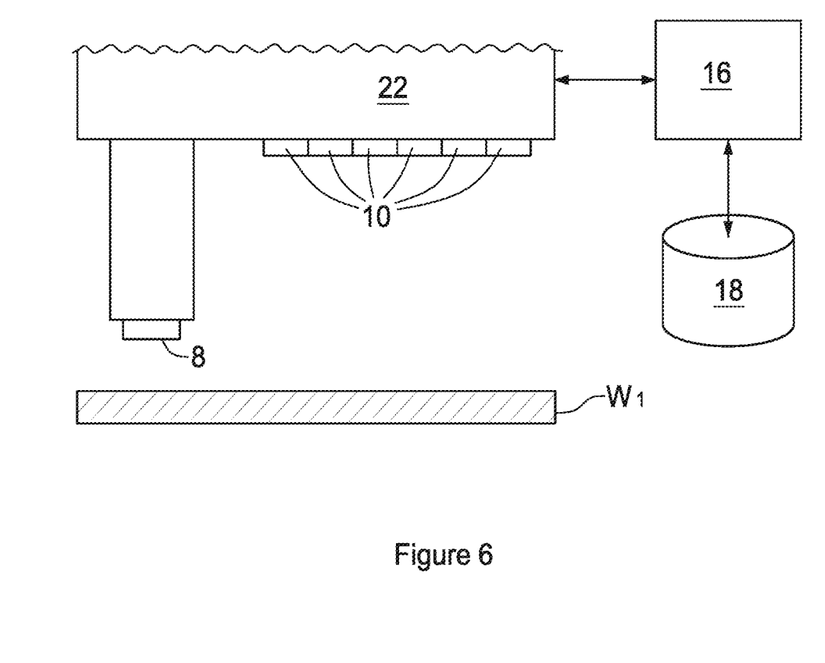
FIG. 6 schematically depicts a measurement system that may be used to determine a height profile of the substrates illustrated using FIG. 5.

FIG. 6 schematically depicts a measurement system 6 that may be used to determine the height profile. The significant difference with the measurement system of FIG. 3 is that the first sensor arrangement and the second sensor arrangement are fixed to the same frame 22. The second sensor arrangement includes, in the embodiment of FIG. 6, an array of six level sensors 10 each of the level sensors 10 being constructed and arranged to measure a height profile of an area having a width of one fifth of a field on the substrate Wn.

In FIG. 2 four further substrates Wn have been shown as an example. However, it will be evident to the skilled person that the method may be applied to any other amount of further substrates. Also the number of level sensors in the second sensor should be understood not to be limited to the number of six level sensors as referred to above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of determining a height profile of one or more substrates, the method comprising:
    measuring a first height profile of one or more fields on a substrate using a first sensor arrangement, the first height profile being a sum of a first interfield part and a first intrafield part;
    measuring a second height profile of one or more further fields on the substrate or on a further substrate using a second sensor arrangement, the second height profile being a sum of a second interfield part and a second intrafield part;
    determining, from the measurements with the first sensor arrangement, an average first intrafield part of at least one field of the one or more fields of which the first height profile is measured; and
    determining a height profile of the further fields from the second interfield part and the average first intrafield part.

2. The method of claim 1, wherein the second sensor arrangement comprises one or more optical sensors.

3. The method of claim 2, wherein the one or more optical sensors form an array of optical sensors.

4. The method of claim 1, wherein the step of measuring a second height profile of one or more further fields is performed on a further substrate and wherein the substrate and the further substrate have undergone similar process steps.

5. The method of claim 1, wherein measuring the first height profile and/or measuring the second height profile are performed on a lithographic apparatus.

6. The method of claim 1, wherein the first sensor arrangement comprises an air gauge.

7. The method of claim 1, wherein the second height profile extends over substantially the entire substrate or the entire further substrate.

8. The method of claim 1, wherein the height profile of the further fields is determined by adding the average first intrafield part to the second interfield part for each of the further fields.

9. A measurement system configured to determine a height profile of one or more substrates, the measurement system comprising:
    a first sensor arrangement configured to measure a first height profile of one or more fields on a substrate, the first height profile being a sum of a first interfield part and a first intrafield part; and
    a second sensor arrangement configured to measure a second height profile of one or more further fields on the substrate or on a further substrate, the second height profile being a sum of a second interfield part and a second intrafield part; the measurement system further being configured:
    to determine from measurements with the first sensor arrangement an average first intrafield part of at least one field of the one or more fields of which the first height profile is measured; and
    to determine the height profile of the further fields from the second interfield part and the average first intrafield part.

10. The measurement system of claim 9, wherein the first sensor arrangement comprises an air gauge.

11. The measurement system of claim 9, wherein the second sensor arrangement comprises one or more optical sensors.

12. The measurement system of claim 9, wherein the one or more optical sensors form an array of optical sensors.

13. A measurement system configured to determine a height profile of a substrate, the measurement system being configured to:
    measure a first height profile of one or more fields on a substrate using a first sensor arrangement, the first height profile being a sum of a first interfield part and a first intrafield part;
    measure a second height profile of one or more further fields on the substrate or on a further substrate using a second sensor arrangement, the second height profile being a sum of a second interfield part and a second intrafield part;
    determine, from the measurements with the first sensor arrangement, an average first intrafield part of at least one field of the one or more fields of which the first height profile is measured; and
    determine a height profile of the further fields from the second interfield part and the average first intrafield part.

14. A computer readable medium for storing computer readable code, wherein the code, when executed, causes a measurement system to:
    measure a first height profile of one or more fields on a substrate using a first sensor arrangement, the first height profile being the a sum of a first interfield part and a first intrafield part;
    measure a second height profile of one or more further fields on the substrate or on a further substrate using a second sensor arrangement, the second height profile being a sum of a second interfield part and a second intrafield part;
    determine, from the measurements with the first sensor arrangement, an average first intrafield part of at least one field of the one or more fields of which the first height profile is measured; and
    determine a height profile of the further fields from the second interfield part and the average first intrafield part.

* * * * *